(12) United States Patent
Yen

(10) Patent No.: US 10,511,137 B2
(45) Date of Patent: Dec. 17, 2019

(54) LASER MODULE WITH A FLATTENED STRUCTURE ON A MOBILE DEVICE FOR IMAGE MEASUREMENT

(71) Applicant: CONARY ENTERPRISE CO., LTD., Taipei (TW)

(72) Inventor: Hsien-Cheng Yen, Taipei (TW)

(73) Assignee: Conary Enterprise Co., Ltd., Taipei (TW)

( * ) Notice: Subject to any disclaimer, the term of this patent is extended or adjusted under 35 U.S.C. 154(b) by 0 days.

(21) Appl. No.: 15/951,300

(22) Filed: Apr. 12, 2018

(65) Prior Publication Data

US 2019/0319423 A1    Oct. 17, 2019

(51) Int. Cl.
| | |
|---|---|
| *H01S 5/00* | (2006.01) |
| *H01S 5/022* | (2006.01) |
| *H01S 5/0687* | (2006.01) |
| *G01C 3/08* | (2006.01) |
| *H04N 5/232* | (2006.01) |
| *H01S 5/042* | (2006.01) |

(52) U.S. Cl.
CPC .......... *H01S 5/02216* (2013.01); *G01C 3/08* (2013.01); *H01S 5/02252* (2013.01); *H01S 5/02288* (2013.01); *H01S 5/02292* (2013.01); *H01S 5/0427* (2013.01); *H01S 5/0687* (2013.01); *H04N 5/23216* (2013.01); *H04N 5/23241* (2013.01); *H04N 5/23293* (2013.01); *H04N 5/23296* (2013.01)

(58) Field of Classification Search
CPC ............ H01S 5/02216; H01S 5/02252; H01S 5/02288; H01S 5/02292; H01S 5/0427; H01S 5/0687; G01C 3/08; H04N 5/23216; H04N 5/23241; H04N 5/23293; H04N 5/23296
See application file for complete search history.

(56) References Cited

U.S. PATENT DOCUMENTS

| | | | |
|---|---|---|---|
| 2004/0075162 A1* | 4/2004 | Boyer ................. | H01S 5/02216 257/675 |
| 2005/0105572 A1* | 5/2005 | Simoun-Ou ........ | H01S 5/02212 372/36 |
| 2006/0114950 A1* | 6/2006 | Yen ..................... | H01S 5/02212 372/28 |
| 2006/0187980 A1* | 8/2006 | Yeh .................... | H01S 5/02248 372/34 |
| 2014/0056118 A1* | 2/2014 | Kim .................... | G11B 7/1263 369/124.1 |

\* cited by examiner

*Primary Examiner* — Zhihan Zhou
(74) *Attorney, Agent, or Firm* — Rosenberg, Klein & Lee

(57) ABSTRACT

A laser module with a flattened structure is installed on a mobile device for a camera program installed in the mobile device to operate photo-taking and image measurement. The laser module includes a printed circuit board (PCB), a photodiode embedded on the PCB, an automatic power control integrated circuit embedded on the PCB, and a laser diode chip electrically connected to the PCB. The flattened structure has a top surface of the PCB, a detection surface of a photodiode chip, a first surface of the automatic power control integrated circuit, a connecting surface of the laser diode chip sharing a common plane surface for operation.

11 Claims, 14 Drawing Sheets

LASER MODULE WITH A FLATTENED STRUCTURE ON A MOBILE DEVICE FOR IMAGE MEASUREMENT

BACKGROUND OF THE INVENTION

1. Field of the Invention

The present invention relates to a camera program installed in and operated by a mobile device with a laser module installed on the mobile device for image measurement. The laser module has a top surface of a PCB, a detection surface of a photodiode chip, a first surface of an automatic power control IC, and a connecting surface of a laser diode chip sharing a common plane surface.

2. Description of the Related Art

Laser diode modules are commonly applied in distance measurement; one of the applications is to be installed on mobile devices for photo taking and image measurement. Moreover, as technology is getting more and more advanced, it is a trend to reduce the size and thickness of the mobile devices. However, it is difficult to reduce the thickness of laser diode modules, therefore making it harder to reduce the size and thickness of the mobile devices.

FIG. 1A shows a laser diode module 30 disclosed in U.S. Pat. No. 7,177,333. The laser diode module 30 includes a heat sink 31 a plurality of first pins 32a, second pins 32b as the ground, and third pins (not shown); a first mount base 33 disposed on the heat sink 31 and connected with the second pins 32b; a second mount base 331 disposed at an inner side of the first mount base 33 for a laser diode chip 34 to be embedded thereon; a photo diode chip 35 embedded on the heat sink 31; a metal housing 37 covering on the heat sink 34 with a glass window 371 at a top surface thereof; an APC circuit 36 that has an automatic power control circuit made into a circuit board or integrated circuit and is disposed inside the metal housing 37. The first pins 32a, second pins 32b and the third pins are connected with the laser diode chip 34 and the photo diode chip 35 to form a voltage driving element for the laser diode module 30. FIG. 1B further illustrates the APC circuit 36 disposed inside the laser diode module 30, where VCC is the first pin 32a, GND is the second pin 32b and an external variable resistor (VR) 39 is the third pin.

FIG. 2A is another laser diode module 40 disclosed in U.S. Pat. No. 7,177,331. The laser diode module 40 includes a heat sink 41 with a plurality of pins 42 arranged at a rear thereof, a first mount base 411 disposed on the heat sink 41, a second mount base 412 disposed on the first mount base 411, a laser diode chip 43 embedded on the second mount base 412, a photo diode chip 44 embedded on the heat sink 41, and a metal housing 45 covering on the heat sink 41. The laser diode module 40 has a circuit with high-frequency current removing light noises from the laser diode module 40 integrated into a high-frequency modulation IC 46, and the high-frequency modulation IC 46 is encapsulated in the metal housing 45 and then electrically connected to the pins 42 and the laser diode chip 43. The pins 42 includes a first pin 43a, a second pin 42b, a third pin (not shown), and a fourth pin 42d. In FIG. 2B, the first pin 43a is the positive electrode of the laser diode chip 43, connected to an APC circuit 48; the second pin 42b is the negative electrode of the high-frequency modulation IC 46, laser diode chip 43, and the photo diode chip 44, connecting to the ground; the third pin is the positive electrode of the high-frequency modulation IC 46; and the fourth pin 42d is the positive electrode of the photo diode chip 44 connecting to the APC circuit 48.

The conventional laser diode modules 30, 40 has their laser diode chip 34, 43, photo diode chip 35, 44, and APC circuit 36, 48 individually disposed on the modules at different heights, making it difficult to reduce the thickness of the modules 30, 40

SUMMARY OF THE INVENTION

A primary objective of the present invention is to provide a laser module that has a top surface of a PCB, a detection surface of a photodiode chip, a first surface of an automatic power control IC, and a connecting surface of a laser diode chip sharing a common plane surface to reduce thickness of the laser module.

To achieve the objective mentioned above, the present invention comprises a printed circuit board including a top surface, a bottom surface, and a connecting section arranged under said bottom surface for electrical connection; a photodiode chip including a detection surface and embedded on said printed circuit board for said detection surface to share a common plane surface with said top surface of said printed circuit board and for said photodiode chip to be coupled to said printed circuit board; an automatic power control integrated circuit including a first surface and embedded on said printed circuit board for said first surface to share a common plane surface with said top surface of said printed circuit board and with said detection surface of said photodiode chip and for said automatic power control integrated circuit to be coupled to said printed circuit board and said photodiode chip; and a laser diode chip including a connecting surface and electrically connected to said printed circuit board for said connecting surface to share a common plane surface with said top surface of said printed circuit board, said detection surface of said photodiode chip, and said first surface of said automatic power control integrated circuit and for the laser diode chip to be coupled with said printed circuit board, said photodiode chip, and said automatic power control integrated circuit.

The laser diode chip has a negative electrode layer and a positive electrode layer, said positive electrode layer including a ridge section, and has a first end and a second end respectively emitting a first laser beam and a second laser beam, said laser diode chip disposed partially on said printed circuit board for said first end to remain out of contact from said top surface of said printed circuit board, thereby avoiding the first laser beam from being emitted to said top surface, and for said second end to be close to said detection surface of said photodiode chip, thereby emitting the second laser beam to said detection surface for operation; whereby upon the detection surface of the photodiode chip detecting a power range of the second laser beam, the automatic power control integrated circuit adjusts a power range of the first laser beam accordingly.

The present invention further comprises a case body to encapsulate the printed circuit board, the photodiode chip, the automatic power control integrated circuit and the laser diode chip and leave the connecting section of the printed circuit board uncovered outside said case body, said case body including a light emitting hole; a collimating lens disposed in said case body at a front of said laser diode chip to collimate said first laser beam and form a collimated light; a reflector disposed in said case body at a front of said collimating lens at an angle of 135° to refract said collimated light at 90° to said light emitting hole of the case body.

A high-frequency modulation integrated circuit is embedded on the printed circuit board and includes a second surface for said second surface to share a common plane surface with said top surface of said printed circuit board, said detection surface of said photodiode chip, said first surface of said automatic power control integrated circuit, and said connecting surface of said laser diode chip for the high-frequency modulation integrated circuit to be coupled with said printed circuit board, said photodiode chip, said automatic power control integrated circuit, and said laser diode chip.

Furthermore, the present invention comprises a mobile device including a housing with an opening hole, a motherboard installed in the housing, a microprocessor installed on the motherboard, a memory unit installed on the motherboard and electrically connected to the microprocessor, a camera unit installed on a rear surface of the housing and electrically connected to the microprocessor to retrieve an image at a pre-determined angle with a horizontal distance shown on said image, and a touch screen installed on a front surface of the housing and electrically connected to the microprocessor to display the image; whereby the connecting section of the printed circuit board is adhered on the motherboard of the mobile device for the laser module with flattened structure to be operated by the microprocessor; the laser module is arranged at a pre-determined distance from the camera unit and projecting a collimated light parallel with an optic axis retrieved by the camera unit, said optic axis and collimated light respectively adjusted perpendicularly to said horizontal distance on the image for an end of said optic axis and a point of the collimated light both projected to said horizontal distance; and a camera program installed in the memory unit and operated by the microprocessor to activate the camera unit, record the image and thereby retrieve an image data, said image data including pixel values for further retrieving of a set of pixel values horizontally and a pixel value of a dot within the set of pixel value; whereby the microprocessor matches the set of pixel values with the horizontal distance and sets the point of the collimated light as the dot in the image, rendering a reference point for measurement with the pixel value of the dot.

The laser diode chip comprises a negative electrode layer and a positive electrode layer, said positive electrode layer including a ridge section, and has a first end and a second end respectively emitting a first laser beam and a second laser beam, said laser diode chip disposed partially on said printed circuit board for said first end to remain out of contact from said top surface of said printed circuit board, thereby avoiding the first laser beam from being emitted to said top surface, and for said second end to be close to said detection surface of said photodiode chip, thereby emitting the second laser beam to said detection surface for operation; whereby upon the detection surface of the photodiode chip detecting a power range of the second laser beam, the automatic power control integrated circuit adjusts a power range of the first laser beam accordingly.

The present invention further has a high-frequency modulation integrated circuit embedded on the printed circuit board and including a second surface for said second surface to share a common plane surface with said top surface of said printed circuit board, said detection surface of said photodiode chip, said first surface of said automatic power control integrated circuit, and said connecting surface of said laser diode chip for the high-frequency modulation integrated circuit to be coupled with said printed circuit board, said photodiode chip, said automatic power control integrated circuit, and said laser diode chip.

The point of the collimated light rendered as the reference point is located within an angle half of the pre-determined angle set for image taking of the camera program and within half of the set of the pixel values, said angle half of a pre-determined angle rendered as a first parameter and a distance from the reference point to the optic axis rendered as a second parameter so that a distance between the laser module and the reference point is calculated by the first and second parameters with functions of tangent and cotangent in the trigonometric functions.

The camera program further has a zooming frame on the image for focusing on the point of the collimated light by finger touching and for setting the pixel value of the point as the pixel value of the dot, thereby a circle for recognition is circling around the dot and a secondary window is displayed on the touch screen with a cross mark to display an enlarged view of the dot for further recognition of a center of the dot by finger touching.

The microprocessor displays a line with measurement data near the dot as the reference point on the touch screen according to the pixel value of the dot after calculation and both ends of the line are extendable by finger touching on the touch screen for further measurement. Then the microprocessor displays an area with measurement data near the dot as the reference point on the touch screen according to the pixel value of the dot after calculation and the area includes at least three ends that are extendable by finger touching on the touch screen for further measurement.

With structures disclosed above, the laser module has the top surface of the PCB, the detection surface of the photodiode chip, the first surface of the automatic power control IC and the connecting surface of the laser diode chip sharing a common plane surface to reduce thickness of the laser module, thereby the laser module is installed on mobile devices with a reduced thickness and the present invention is able to perform instant measurement with the laser module after taking a photo without complicated preparations of measurement tools.

DETAILED DESCRIPTION OF THE PREFERRED EMBODIMENT

Figure 1A:
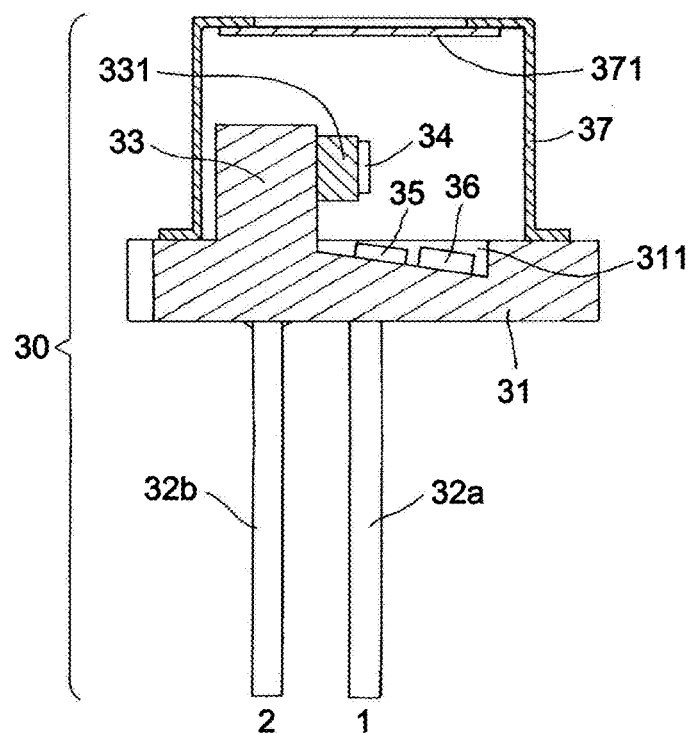
FIG. 1A is a schematic diagram of a conventional laser diode module.
Figure 1B:
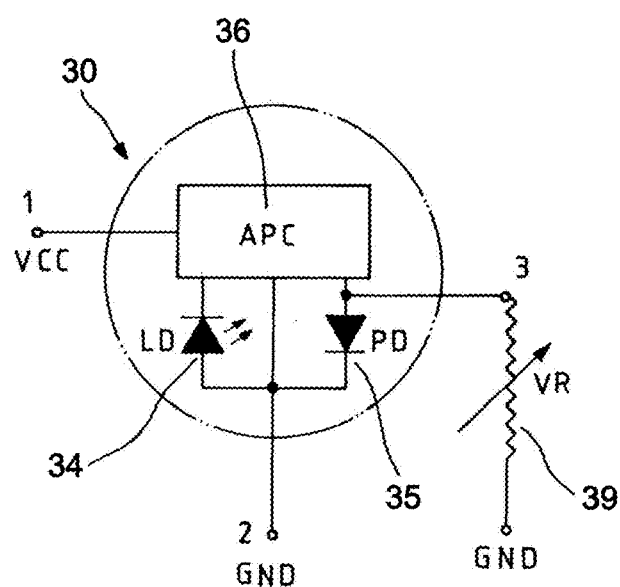
FIG. 1B is a circuit diagram of the conventional laser diode module in FIG. 1A.
Figure 2A:
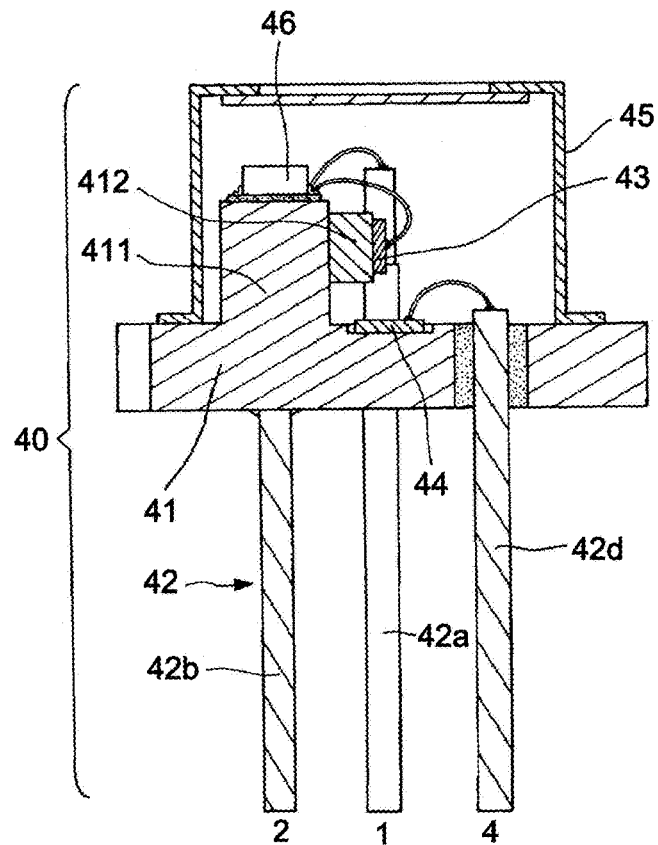
FIG. 2A is a schematic diagram of another conventional laser diode module.
Figure 2B:
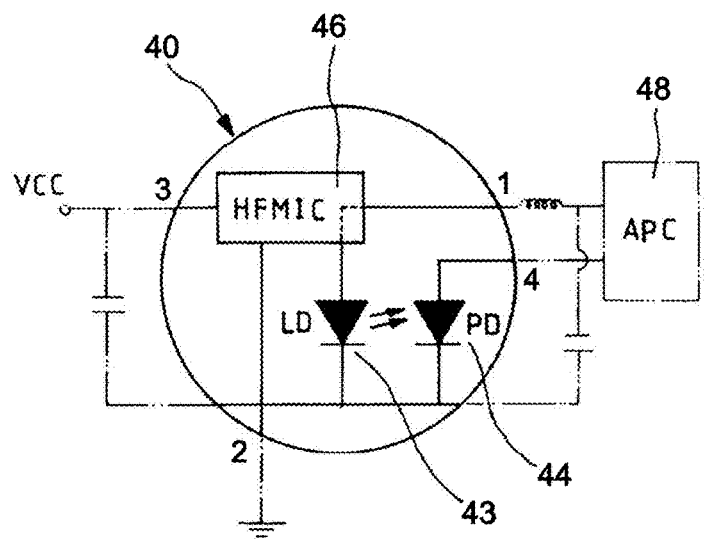
FIG. 2B is a circuit diagram of the conventional laser diode module in FIG. 2A.
Figure 3A:
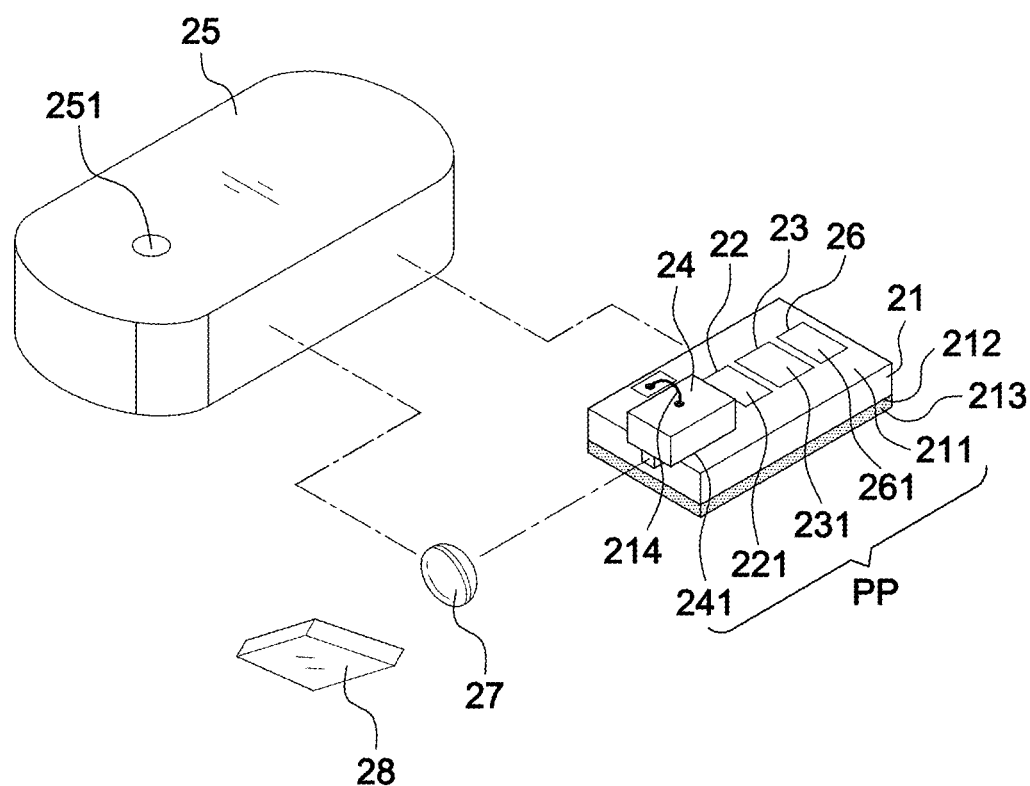
FIG. 3A is an exploded view of a laser module with a flattened structure of the present invention.
Figure 3B:
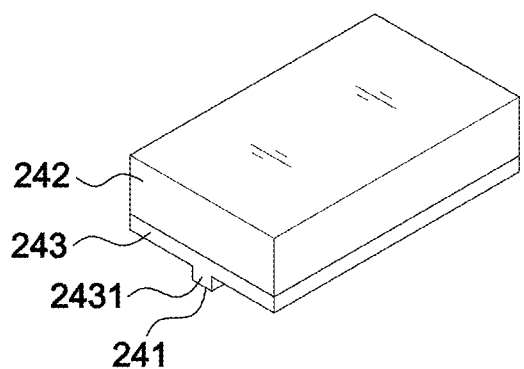
FIG. 3B is a perspective view of a laser diode chip of the present invention.
Figure 3C:
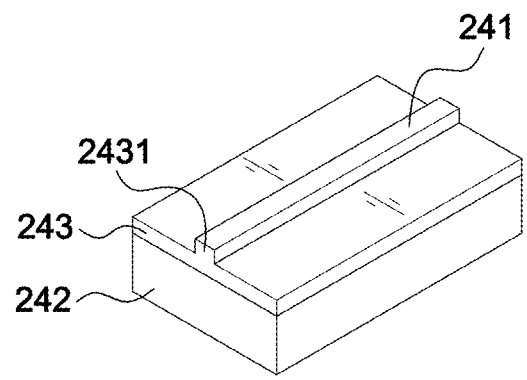
FIG. 3C is another perspective view of the laser diode chip of the present invention.
Figure 3D:
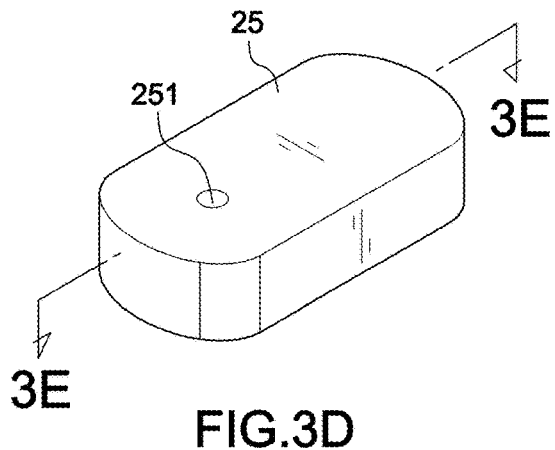
FIG. 3D is a perspective view of the laser module with a flattened structure of the present invention.
Figure 3E:
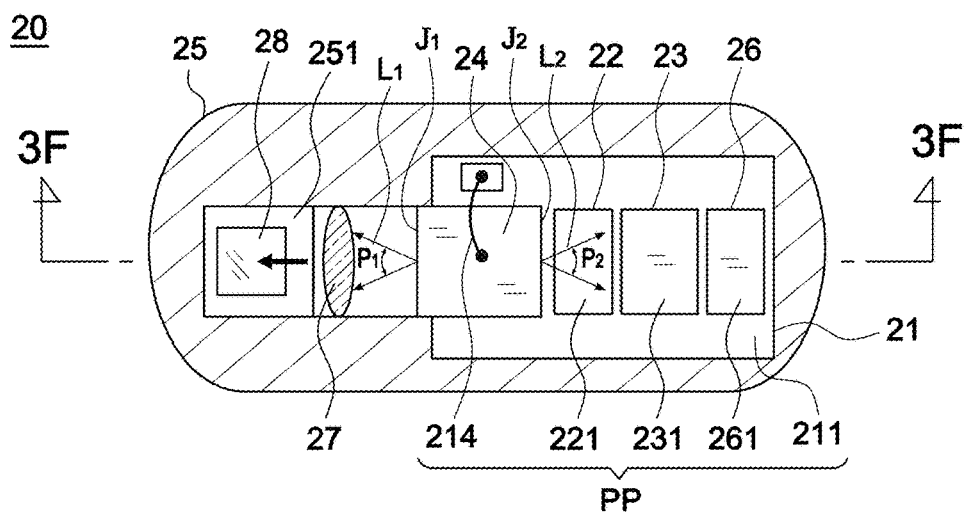
FIG. 3E is a sectional view along line 3E-3E of FIG. 3D.
Figure 3F:
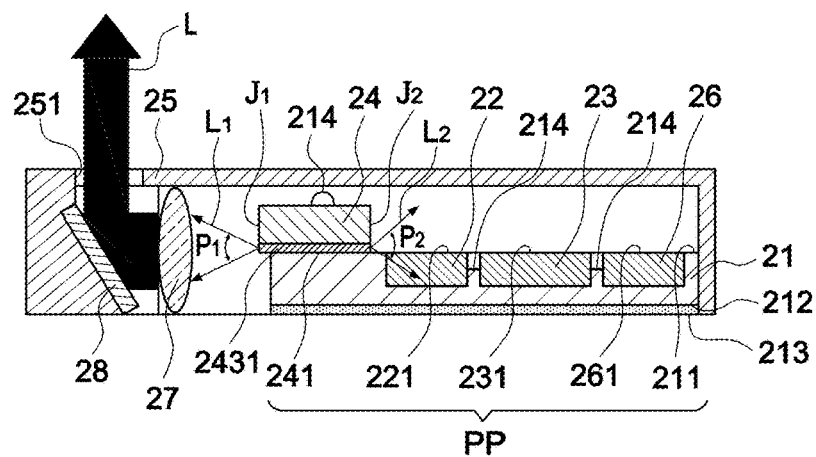
FIG. 3F is a sectional view along line 3F-3F of FIG. 3E.
Figure 4A:
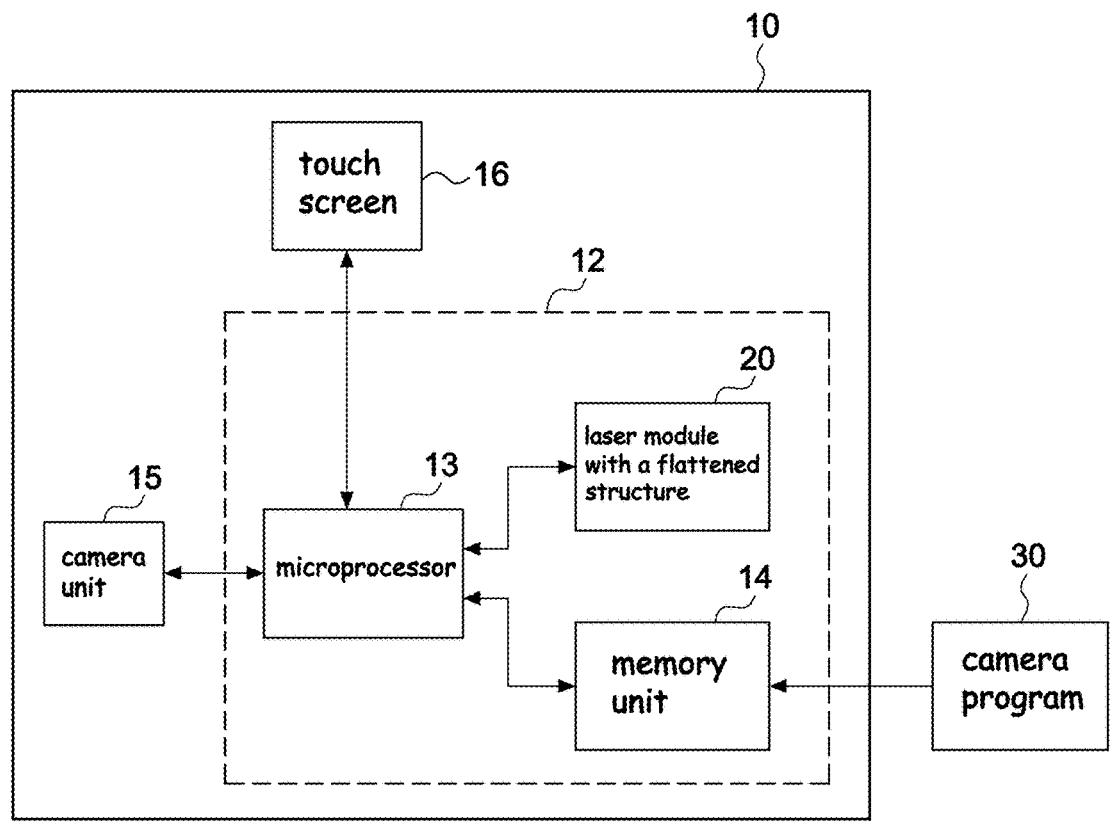
FIG. 4A is a block diagram illustrating a circuit connection of the present invention.
Figure 4B:
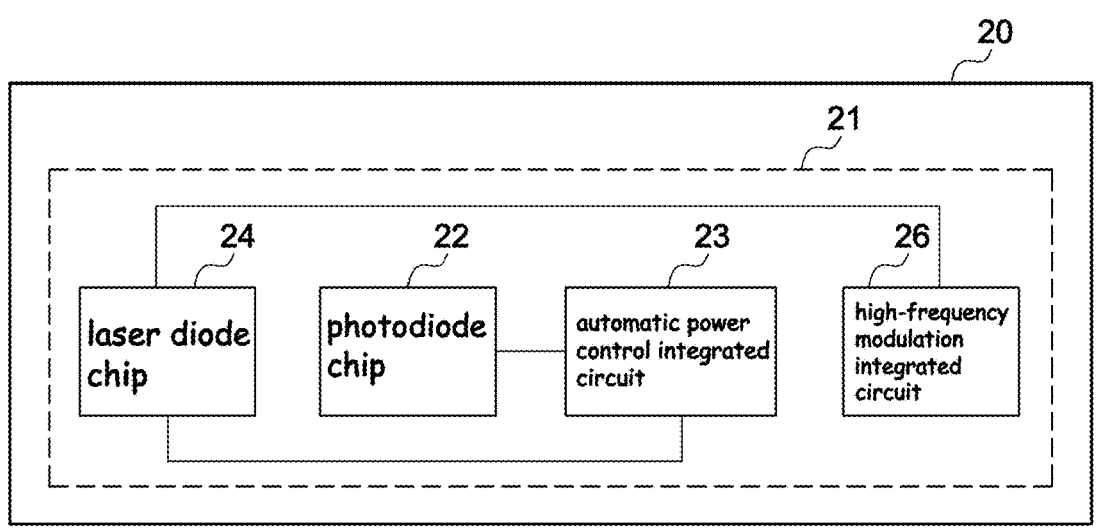
FIG. 4B is a block diagram illustrating a circuit connection of the laser module with a flattened structure.
Figure 5:
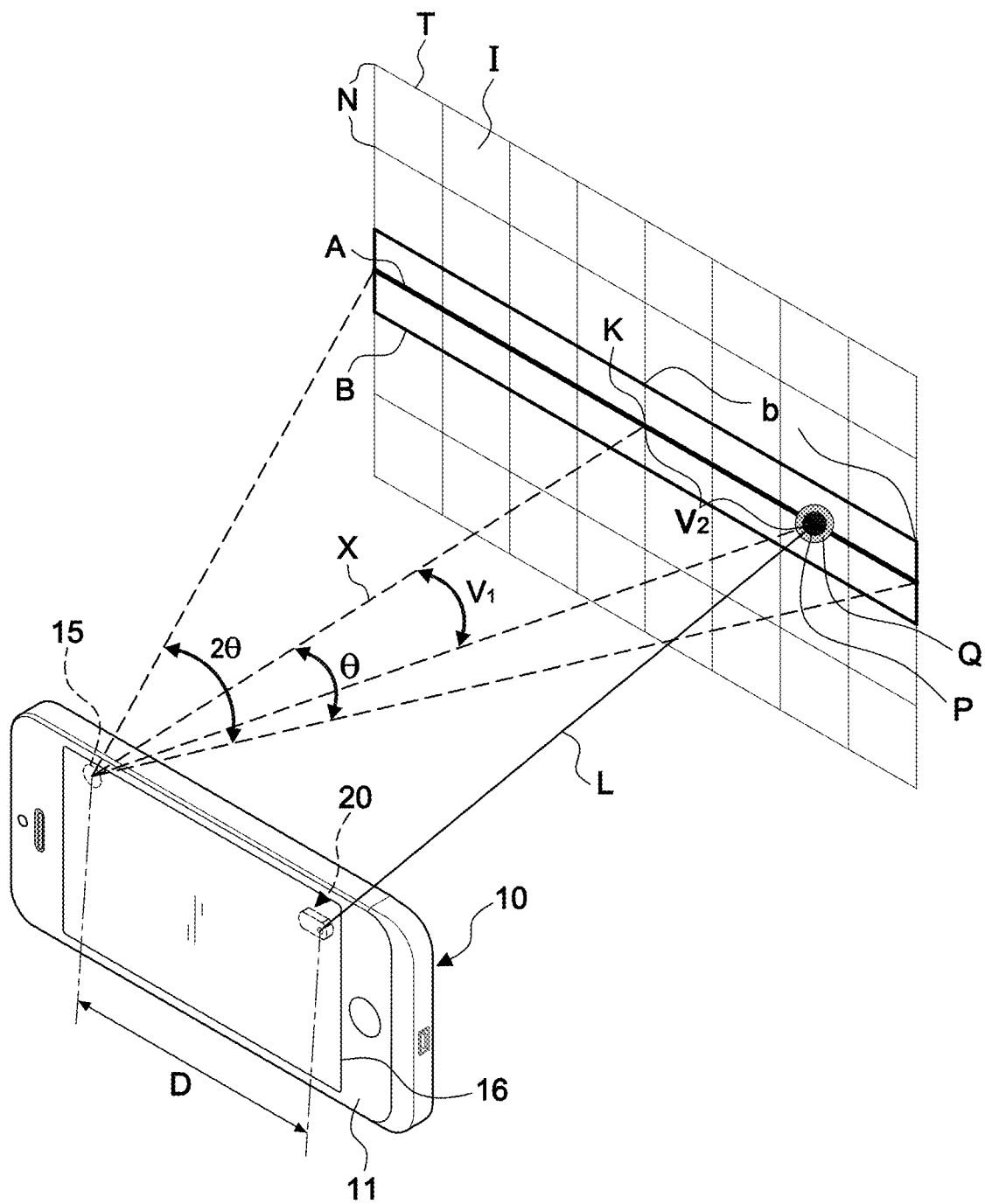
FIG. 5 is a schematic diagram illustrating a camera program on a mobile device performing photo taking and image measurement according to the present invention.
Figure 6A:
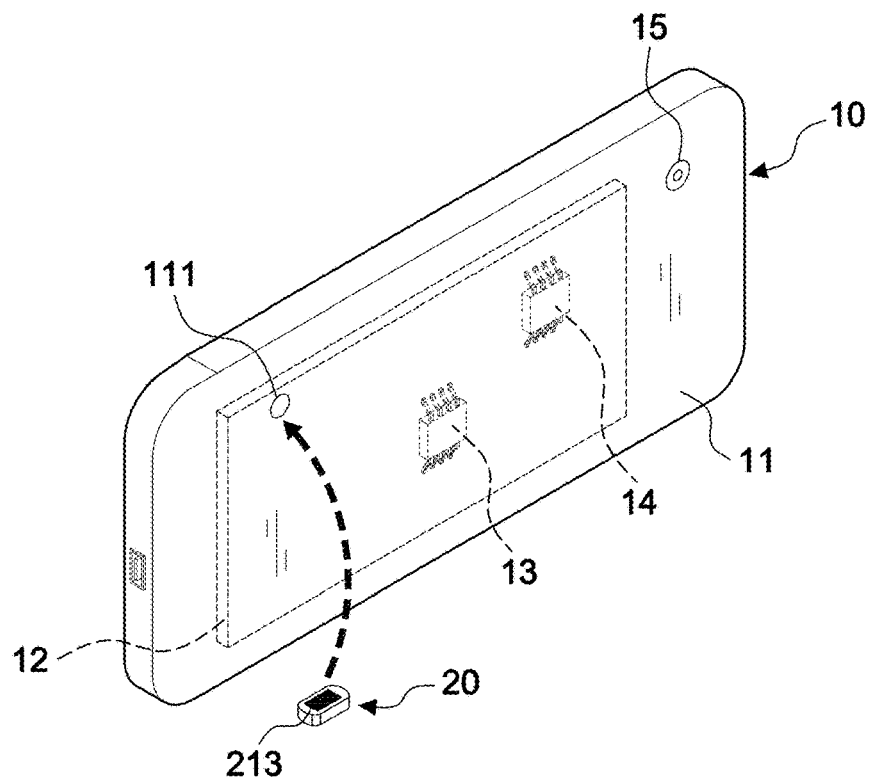
FIG. 6A is an exploded view of the present invention.
Figure 6B:
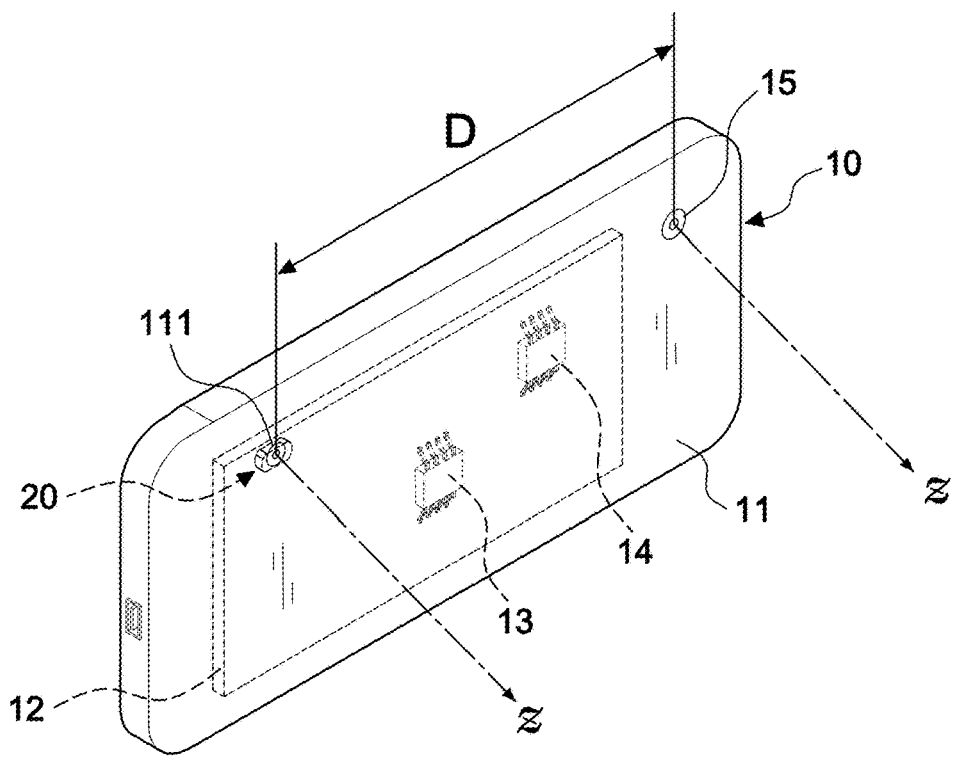
FIG. 6B is a perspective view of the present invention.
Figure 6C:
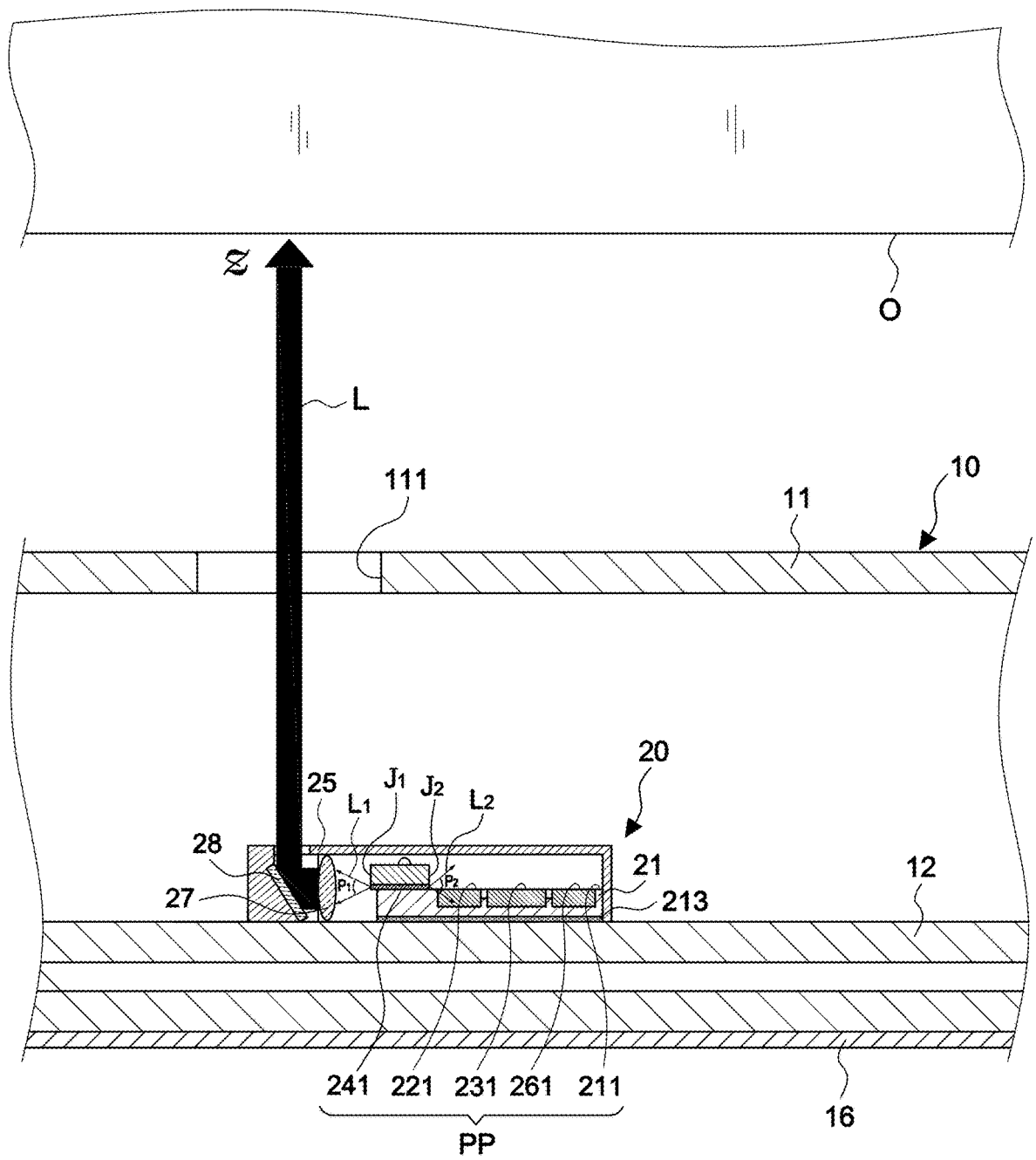
FIG. 6C is an enlarged sectional view of the present invention.
Figure 7A:
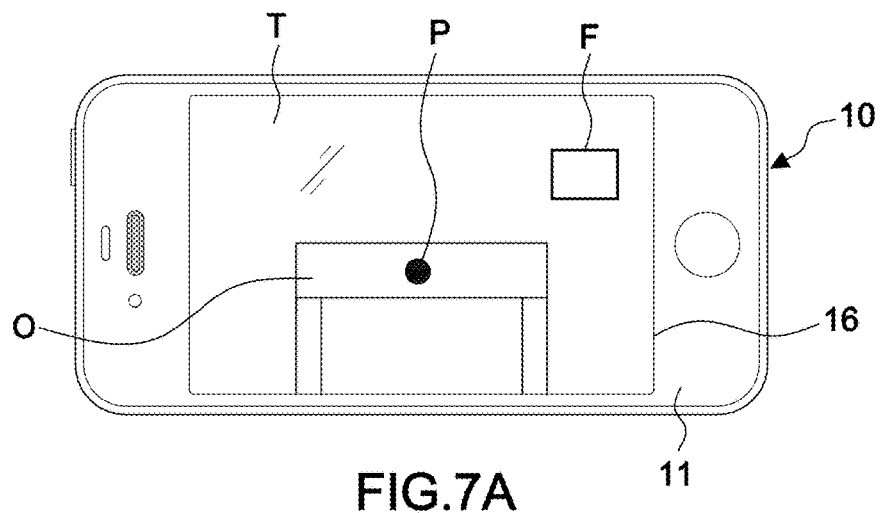
FIG. 7A is a schematic diagram displaying a zooming frame on an image taken by the mobile device according to the present invention.
Figure 7B:
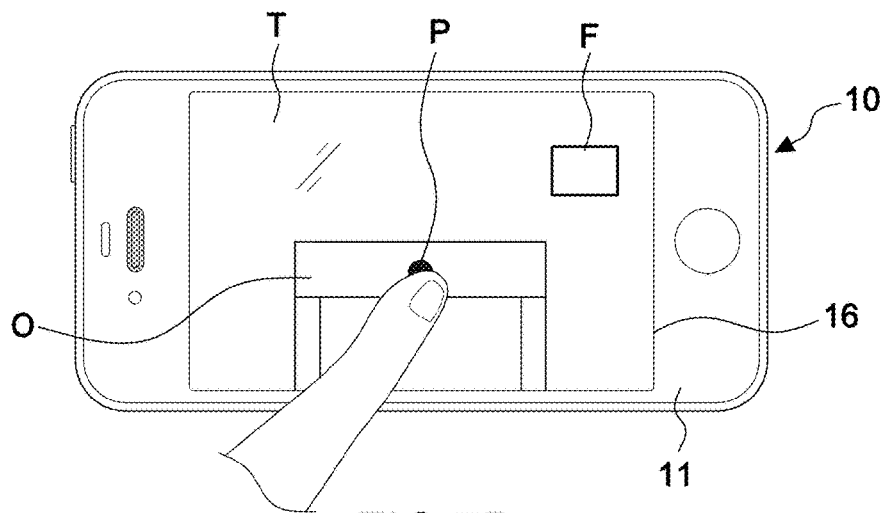
FIG. 7B is a schematic diagram illustrating a point of a collimated light set by finger touching according to the present invention.
Figure 7C:
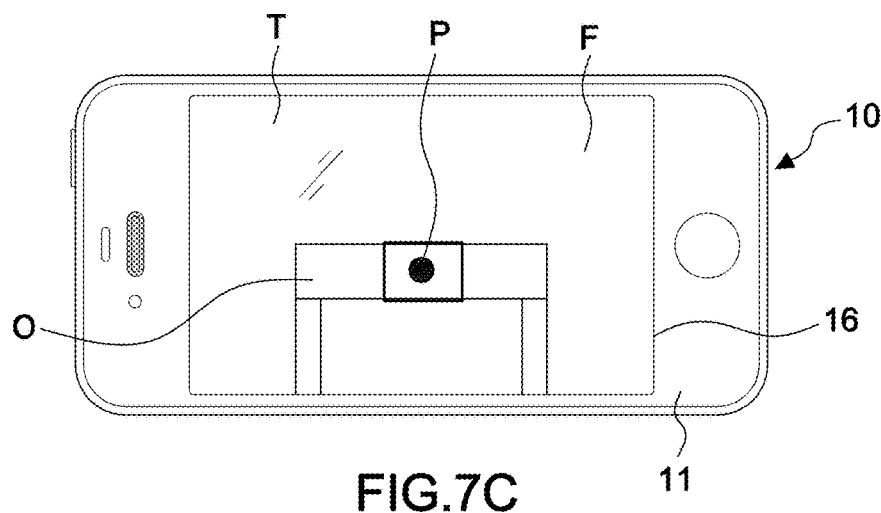
FIG. 7C is a schematic diagram illustrating the zooming frame focusing on the point of the collimated light according to the present invention.
Figure 7D:
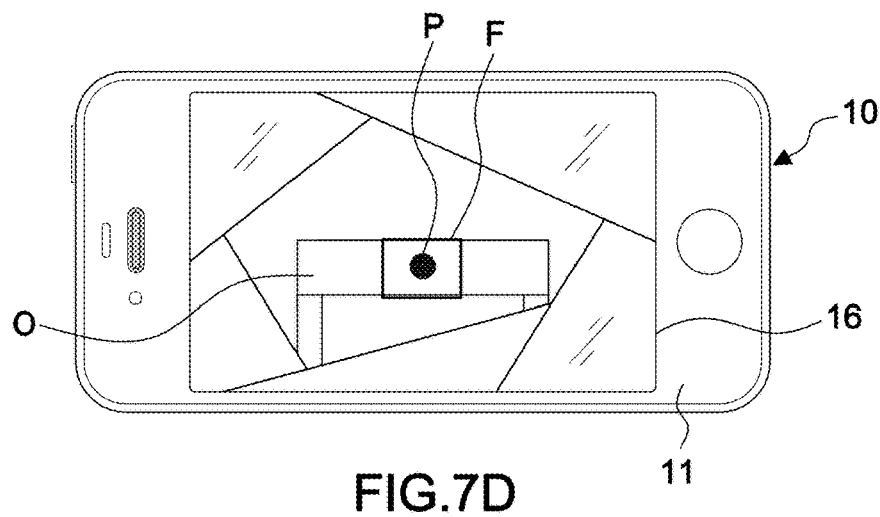
FIG. 7D is a schematic diagram illustrating a camera program taking an image according to the present invention.
Figure 7E:
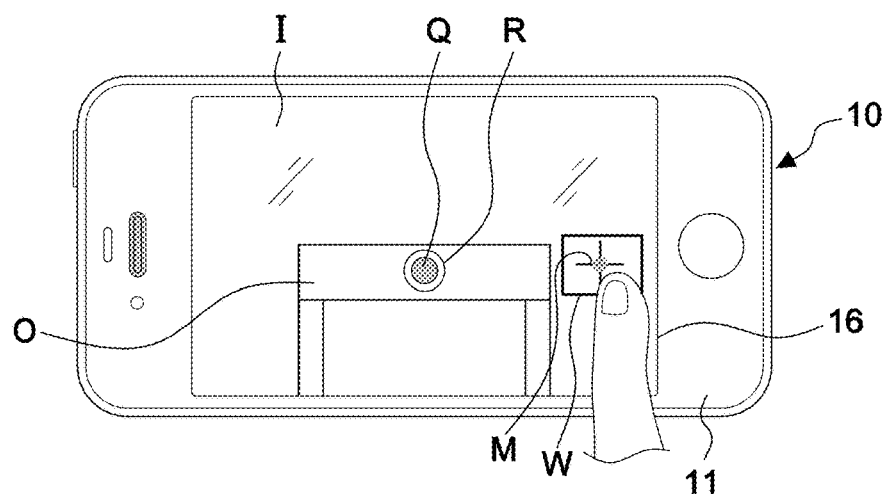
FIG. 7E is a schematic diagram illustrating the camera program locating a center of a pixel value of a dot in the image according to the present invention.
Figure 7F:
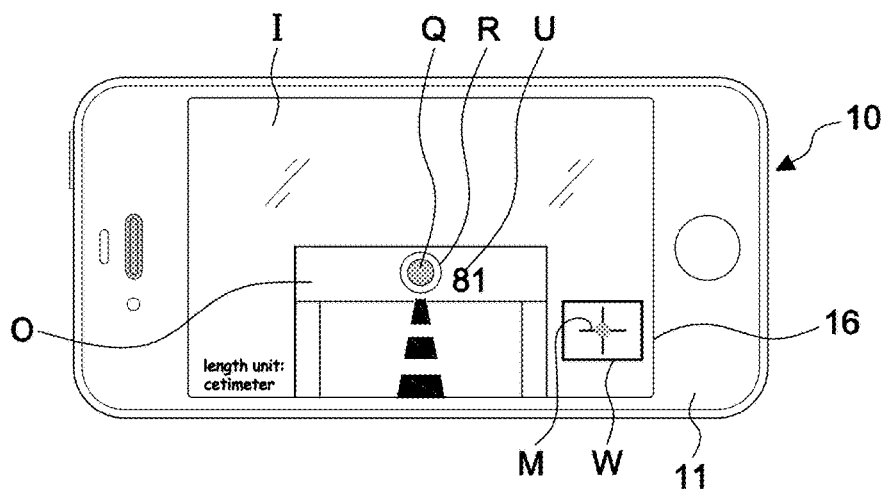
FIG. 7F is a schematic diagram illustrating measurement data displayed on a touch screen of the mobile device.
Figure 8A:
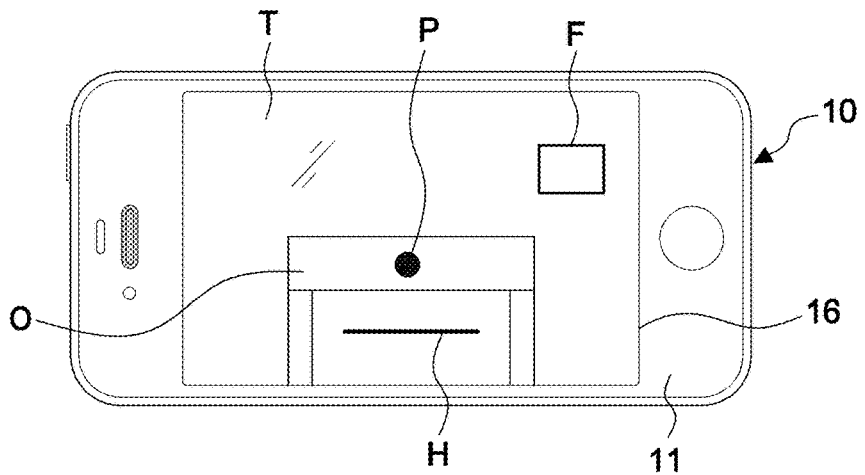
FIG. 8A is a schematic diagram displaying the zooming frame and a baseline on an image taken by the mobile device.
Figure 8B:
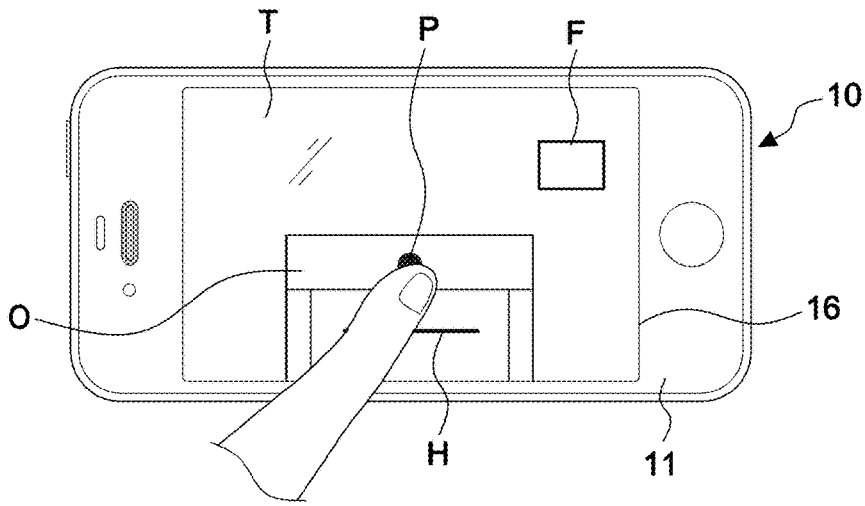
FIG. 8B is another schematic diagram illustrating the point of the collimated light set by finger touching.
Figure 8C:
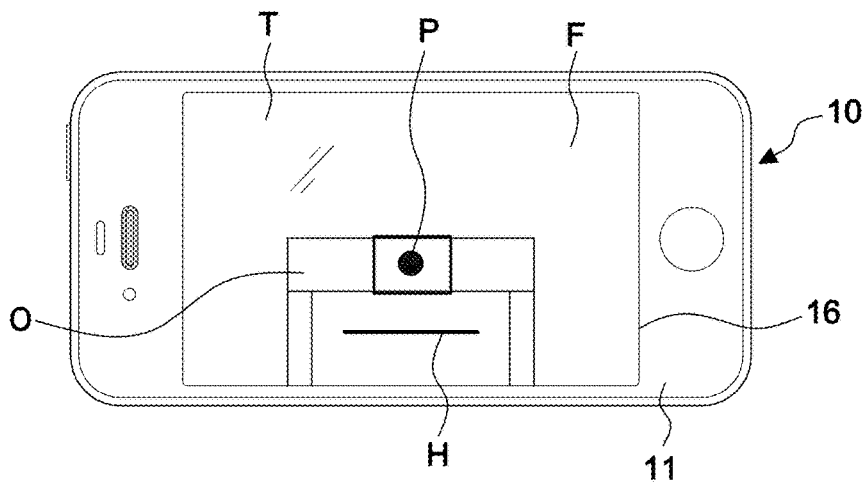
FIG. 8C is another schematic diagram illustrating the zooming frame focusing on the point of the collimated light.
Figure 8D:
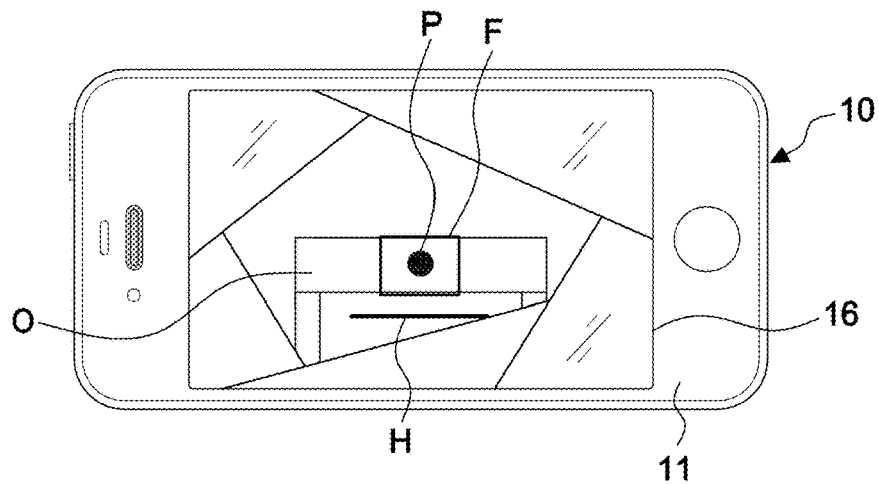
FIG. 8D is another schematic diagram illustrating the camera program taking an image.
Figure 8E:
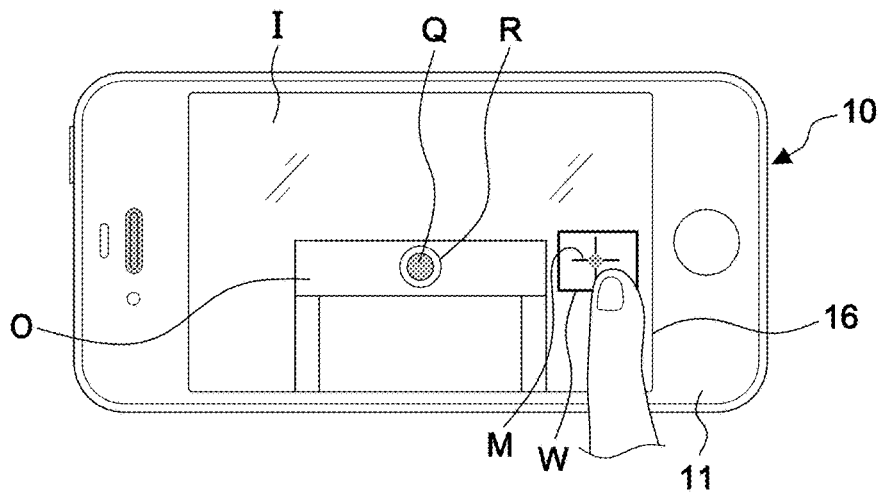
FIG. 8E is another schematic diagram illustrating the camera program locating a center of a pixel value of a dot in the image according to the present invention.
Figure 8F:
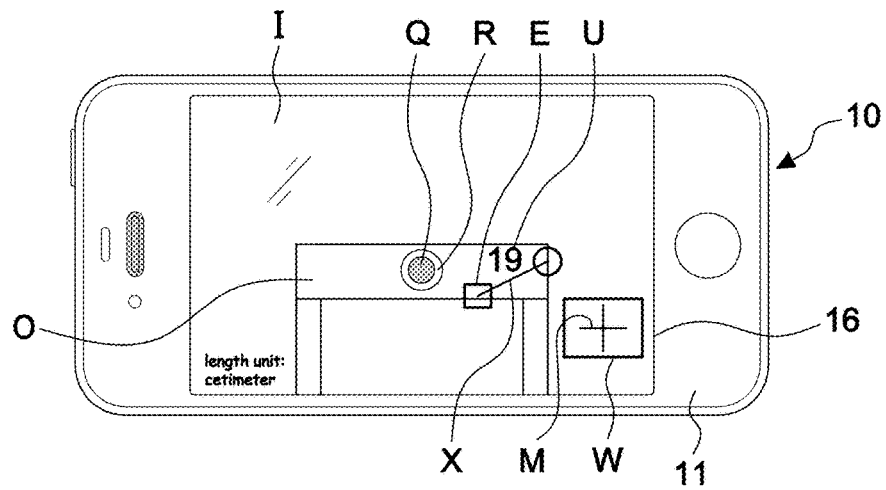
FIG. 8F is a schematic diagram illustrating a extendable line displayed on the touch screen for measurement.
Figure 8G:
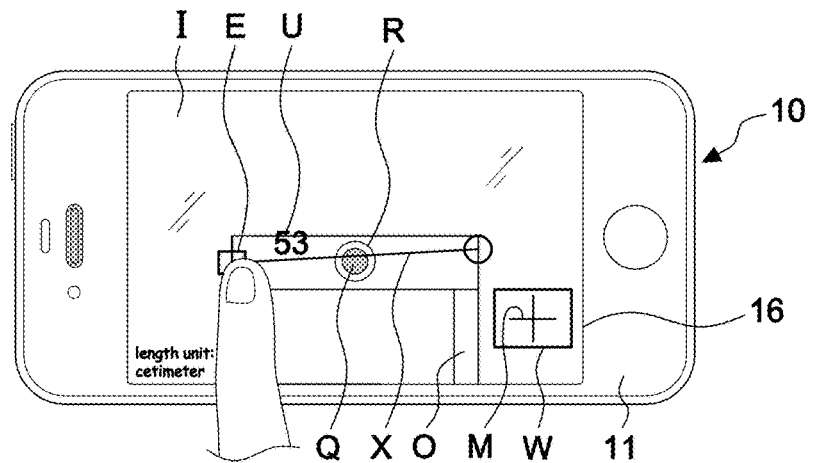
FIG. 8G is a schematic diagram illustrating an end of the extendable line adjusted by finger touching.
Figure 8H:
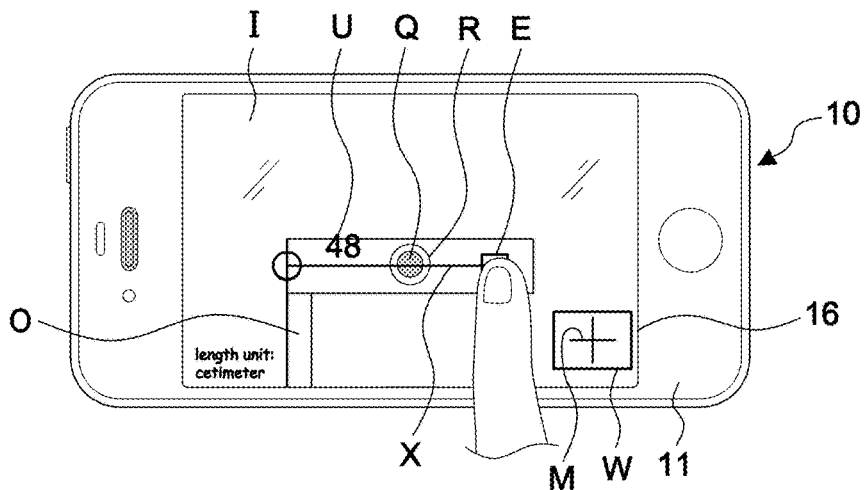
FIG. 8H is a schematic diagram illustrating another end of the extendable line adjusted by finger touching.
Figure 8I:
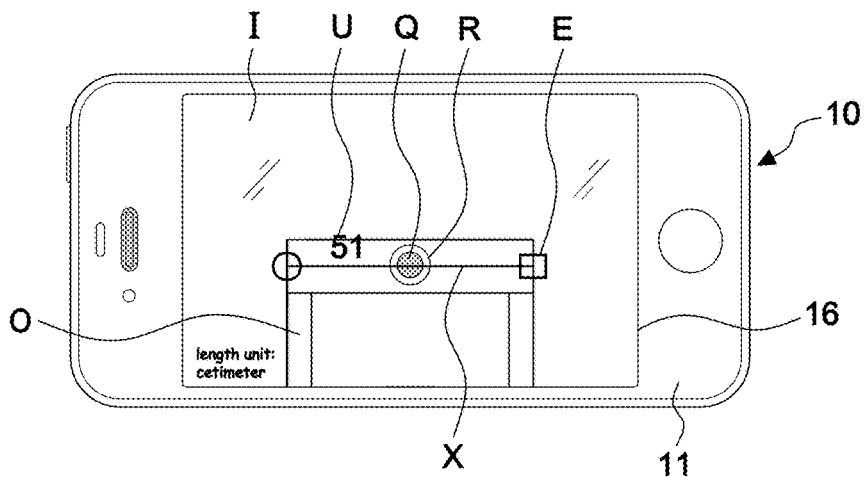
FIG. 8I is a schematic diagram illustrating the extendable line after being adjusted.

Referring to FIGS. 3A-9B, a preferred embodiment of the present invention mainly comprises a mobile device 10, a laser module 20 with a flattened structure and a camera program 30.

The mobile device 10 includes a housing 11 with an opening hole 111 at a rear side thereof, a motherboard 12 installed in the housing 11, a microprocessor 13 installed on the motherboard 12, a memory unit 14 installed on the motherboard 12 and electrically connected to the microprocessor 13, a camera unit 15 installed on a rear surface of the housing 11 and electrically connected to the microprocessor 13 to retrieve an image T at a pre-determined angle 2θ with a horizontal distance A shown on the image T, and a touch screen 16 installed on a front surface of the housing 11 and electrically connected to the microprocessor 13 to display the image T.

The laser module 20 comprises a printed circuit board (PCB) 21, a photodiode 22, an automatic power control IC 23, a laser diode chip 24, a case body 25, a collimating lens 27, and a reflector 28.

The PCB 21 includes a top surface 211, a bottom surface 212, and a connecting section 213 arranged under the bottom surface 212 for electrical connection. The photodiode chip 22 includes a detection surface 221 and is embedded on the PCB 21 for the detection surface 221 to share a common plane surface PP with the top surface 211 of the PCB 21 and for the photodiode chip 22 to be coupled to the PCB 21.

The automatic power control IC 23 includes a first surface 231 and is embedded on the PCB 21 for the first surface 231 to share a common plane surface PP with the top surface 211 of the PCB 21 and the detection surface 221 of the photodiode chip 22; the automatic power control IC 23 is thereby coupled to the PCB 21 and the photodiode chip 22.

The laser diode chip 24 includes a connecting surface 241 and is electrically connected to the PCB 21 for the connecting surface 241 to share a common plane surface PP with the top surface 211 of the PCB 21, the detection surface 221 of the photodiode chip 22, and the first surface 231 of the automatic power control IC 23; the laser diode chip 24 is thereby coupled with the PCB 21, the photodiode chip 22, and the automatic power control IC 23.

The case body 25 encapsulates the PCB 21, the photodiode chip 22, the automatic power control IC 23 and the laser diode chip 24 but leaves the connecting section 213 of the PCB 21 uncovered outside the case body 25. And the case body 25 includes a light emitting hole 251. The collimating lens 27 is disposed in the case body 25 at a front of the laser diode chip 24 to collimate a first laser beam $L_1$ emitted from the laser diode chip 24 and form a collimated light L. The reflector 28 is disposed in the case body 25 at a front of the collimating lens 27 at an angle of 135° to refract the collimated light L at 90° to the light emitting hole 251 of the case body 25.

The collimated light L is emitted by the laser module 20 to the opening hole 111 on the housing 11 of the mobile device 10. The connecting section 213 of the PCB 21 is adhered on the motherboard 12 of the mobile device 10 for the laser module 20 with flattened structure to be operated by the microprocessor 13. The laser module 20 is arranged at a pre-determined distance D from the camera unit 15 and projects the collimated light L parallel with an optic axis C retrieved by the camera unit 15. The optic axis C and collimated light L are respectively adjusted perpendicular to the horizontal distance A on the image T for an end K of the optic axis C and a point P of the collimated light L to be projected to the horizontal distance A.

The laser diode chip 24 has a negative electrode layer 242 and a positive electrode layer 241. The positive electrode layer 241 includes a ridge section 2431 and has a first end $J_1$ and a second end $J_2$ respectively emitting a first laser beam $L_1$ and a second laser beam $L_2$; the laser diode chip 24 is disposed partially on the PCB 21 for the first end $J_1$ to remain out of contact from the top surface 211 of the PCB 21, thereby avoiding the first laser beam $L_1$ from being emitted to the top surface 211 and for the second end $J_2$ to be close to the detection surface 221 of the photodiode chip 22, thereby emitting the second laser beam $L_2$ to the detection surface 221 for operation. Upon the detection surface 221 of the photodiode chip 22 detecting a power range $P_2$ of the second laser beam $L_2$, the automatic power control IC 23 adjusts a power range $P_1$ of the first laser beam $L_1$ accordingly.

In this embodiment, the present invention further comprises a high-frequency modulation IC 26 embedded on the PCB 21 and including a second surface 261 which shares a common plane surface PP with the top surface 211 of the PCB 21, the detection surface 221 of the photodiode chip 22, and the first surface 231 of the automatic power control IC 23 for the high-frequency modulation IC 26 to be coupled with the PCB 22, the photodiode chip 22, the automatic power control IC 23, and the laser diode chip 24; but the present invention is not limited to such application. In addition, the PCB 21, the photodiode chip 22, the automatic power control IC 23, the laser diode chip 24 and the high-frequency modulation IC 26 are mutually coupled with a plurality of electric wires 214.

The camera program 30 is installed and stored in the memory unit 14 and operated by the microprocessor 13 to activate the camera unit 15, record the image T and thereby retrieve an image data I. The image data I includes pixel values N for further retrieving of a set of pixel values B horizontally and a pixel value Q of a dot within the set of pixel value B; whereby the microprocessor 13 matches the set of pixel values B with the horizontal distance A and sets the point P of the collimated light L as the dot in the image T, rendering a reference point for measurement with the pixel value Q of the dot.

In this embodiment, the point P of the collimated light L rendered as the reference point is located within an angle θ half of a pre-determined angle 20 set for image taking of the camera program 30 and within pixel values b half of the set of the pixel values B. Thereby the angle θ is rendered as a first parameter $V_1$ and a distance from the reference point to the optic axis C is rendered as a second parameter $V_2$. Both the optic axis C and the collimated light L are perpendicular to the set of pixel values B; therefore, the distance between the optic axis C and the point P of the collimated light L equals to the distance between the collimated light L and an end K of the optic axis C on the set of pixel values B, and the angle from the optic axis C to the point P equals to the angle from the collimated light L to the end K of the optic axis C on the set of pixel values B. Then the microprocessor 13 of the mobile device 10 is able to calculate a distance between the laser module 20 and the reference point with the first and second parameters $V_1$, $V_2$ applied to functions of tangent and cotangent in the trigonometric functions.

In another embodiment, the collimated light L projected from the laser module 20 is reflected back and received by the laser module 20 after forming the point P on the image T. The time period between projecting the collimated light L and receiving the reflected collimated light L enables the microprocessor 13 to calculate a distance between the laser module 20 and the point P of the collimated light L. After taking and recording the image, the microprocessor 13 is able to render the point P of the collimated light L as the reference point.

As illustrated in FIGS. 7A-7F, the camera program 30 further has a zooming frame F on the image T for focusing on the point P of the collimated light L by finger touching and for setting the pixel value of the point P as the pixel value Q of the dot, thereby a circle R for recognition is circling around the dot and a secondary window W is displayed on the touch screen 16 with a cross mark M to display an enlarged view of the dot for further recognition of a center of the dot by finger touching. In this embodiment, a measurement data U of an object O shown 81 cm, which is the distance from the laser module 20 to the object O.

Figure 9A:
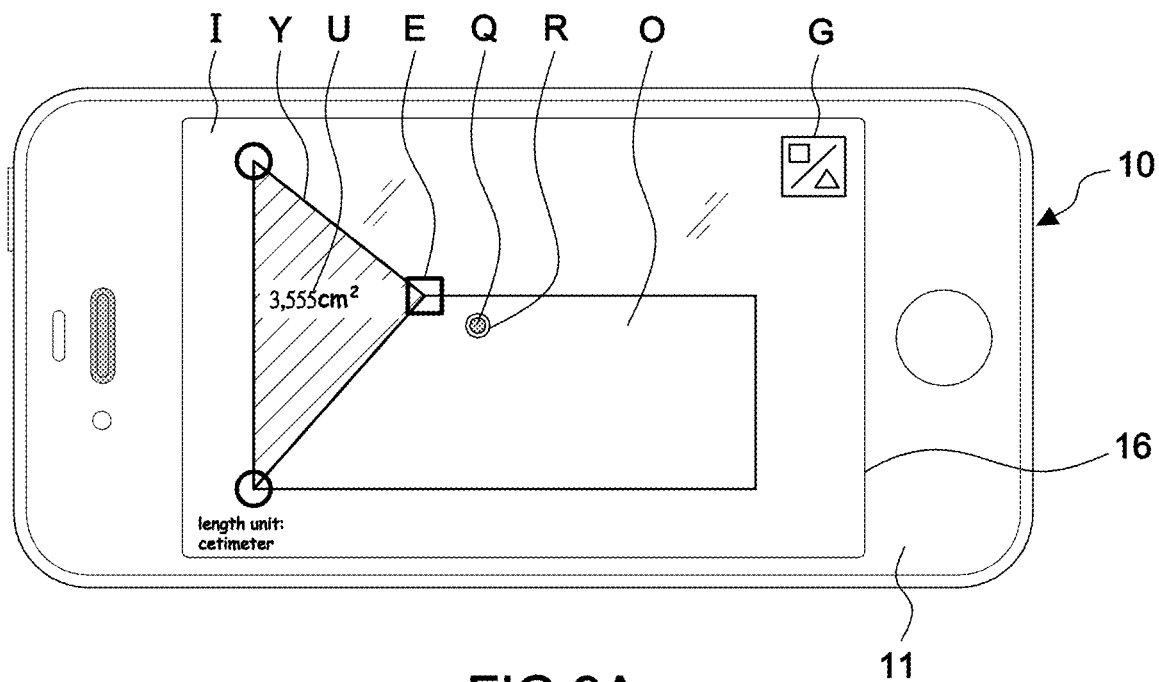
FIG. 9A is a schematic diagram illustrating an area after being adjusted according to the present invention.
Figure 9B:
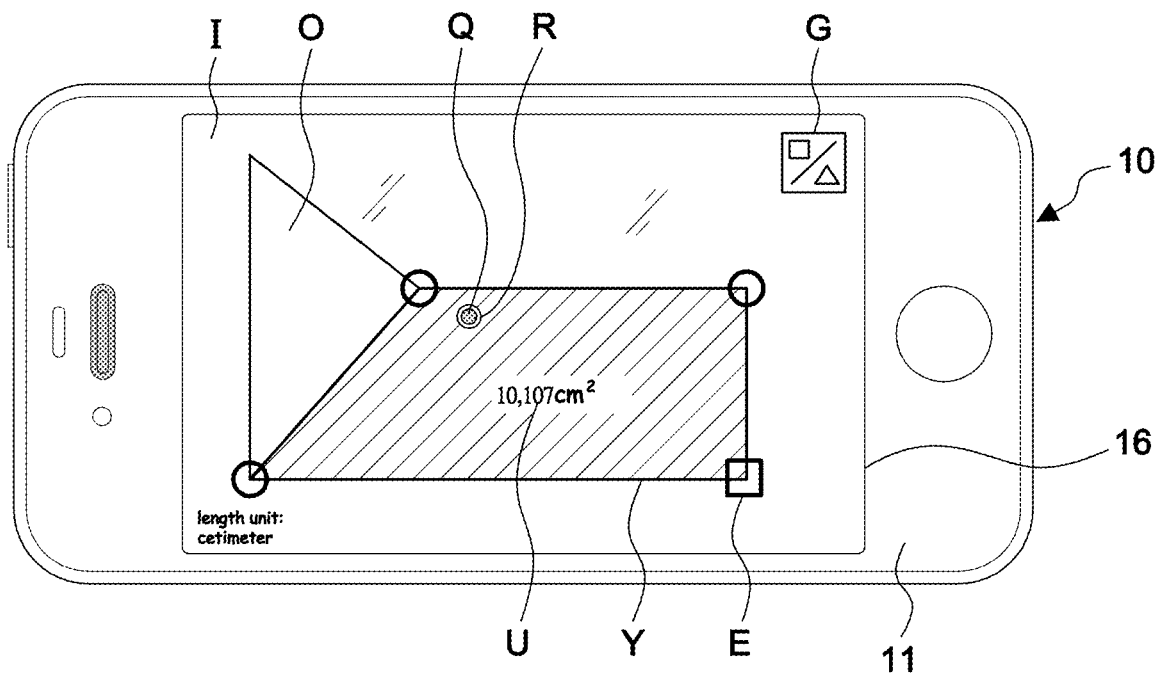
FIG. 9B is a schematic diagram illustrating another area after being adjusted according to the present invention.

As illustrated in FIGS. 8A-8I, the camera program 30 further has a zooming frame F and a horizontal baseline H on the image T and the zooming frame F is focusing on the point P of the collimated light L by finger touching for setting the pixel value of the point P as the pixel value Q of the dot, thereby a circle R for recognition is circling around the dot and a secondary window W is displayed on the touch screen 16 with a cross mark M to display an enlarged view of the dot for further recognition of a center of the dot by finger touching. Then a measurement data U of a distance from the laser module 20 to the object O is saved by the memory unit 14 and can be displayed on the touch screen 16 with the image T thereon and a line X with the measurement data U is displayed near the dot as the reference point on the touch screen 16 according to the pixel value Q of the dot after calculation; both ends E of the line X are extendable by finger touching on the touch screen 16 for further measurement and the line X can be horizontal, vertical, of diagonal. In this embodiment, the measurement data U is 51 cm. Or the microprocessor 13 displays an area Y with a measurement data U near the dot as the reference point on the touch screen 16 according to the pixel value Q of the dot after calculation, and the area Y includes at least three ends E that are extendable by finger touching on the touch screen 16 for further measurement. In FIGS. 9A and 9B, an area selecting button G is shown on the image T and an area Y on the image T can be adjusted by finger touching operation of the area selecting button G. A triangular area Y in FIG. 9A has a measurement data U of 355 $cm^2$ and a square area Y in FIG. 9B has a measurement data of 10107 $cm^2$; or both of the triangular and square areas Y can be combined for further measurement, whereby each end E of the line X or each corner E of the areas Y can be further extended and adjusted with the secondary window W for a more precise measurement setting of the object O. When the ends or corners E are fixed for setting, a small circle is shown around them; when they can be further adjusted or extended, a small square is shown around them.

With the structure disclosed above, the laser module 20 has the top surface 211 of the PCB 21, the detection surface 221 of the photodiode chip 22, the first surface 231 of the automatic power control IC 23, and the connecting surface 241 of a laser diode chip 24 sharing a common plane surface PP to reduce thickness of the laser module; also, it is able to precisely fix an original point and stably projects the collimated light L for the point P of the collimated light L to be stably projected on the object O. The camera program 30 then renders pixel value of the point P as the pixel value Q of the dot for calculation of the microprocessor 13 to obtain a measurement data U of the object O. Meanwhile, an image data I can be transmitted to another device with the camera program installed therein for further measurements. In other words, the present invention enables instant measurement after taking a photo of an image and saves the image and the results for further application; it also allows photos taken in other places by other devices to be measured later by the mobile device 10 with the camera program 30 after transmission, thereby enhancing efficiency and provide conveniences for its users.

What is claimed is:

1. A laser module with a flattened structure, comprising:
a printed circuit board including a top surface, a bottom surface, and a connecting section arranged under said bottom surface for electrical connection;
a photodiode chip including a detection surface and embedded on said printed circuit board for said detection surface to share a common plane surface with said top surface of said printed circuit board and for said photodiode chip to be coupled to said printed circuit board;
an automatic power control integrated circuit including a first surface and embedded on said printed circuit board for said first surface to share a common plane surface with said top surface of said printed circuit board and with said detection surface of said photodiode chip and for said automatic power control integrated circuit to be coupled to said printed circuit board and said photodiode chip; and a laser diode chip including a connecting surface and electrically connected to said printed circuit board for said connecting surface to share a common plane surface with said top surface of said printed circuit board, said detection surface of said photodiode chip, and said first surface of said automatic power control integrated circuit and for the laser diode chip to be coupled with said printed circuit board, said photodiode chip, and said automatic power control integrated circuit, the laser diode chip having a negative electrode layer and a positive electrode layer, said positive electrode layer including a ridge section and having a first end and a second end respectively emitting a first laser beam and a second laser beam, said laser diode chip disposed partially on said printed circuit board for said first end to remain out of contact from said top surface of said printed circuit board, thereby avoiding the first laser beam from being emitted to said top surface, and for said second end to be close to said detection surface of said photodiode chip, thereby emitting the second laser beam to said detection surface for operation; whereby upon the detection surface of the photodiode chip detecting a power range of the second laser beam, the automatic power control integrated circuit adjusts a power range of the first laser beam accordingly.

2. The laser module with a flattened structure as claimed in claim 1, further comprising a case body to encapsulate the printed circuit board, the photodiode chip, the automatic power control integrated circuit and the laser diode chip and leave the connecting section of the printed circuit board uncovered outside said case body, said case body including a light emitting hole; a collimating lens disposed in said case body at a front of said laser diode chip to collimate said first laser beam and form a collimated light; a reflector disposed in said case body at a front of said collimating lens at an angle of 135° to refract said collimated light at 90° to said light emitting hole of the case body.

3. The laser module with a flattened structure as claimed in claim 1, further comprising a high-frequency modulation integrated circuit embedded on the printed circuit board and including a second surface for said second surface to share a common plane surface with said top surface of said printed circuit board, said detection surface of said photodiode chip, said first surface of said automatic power control integrated circuit, and said connecting surface of said laser diode chip for the high-frequency modulation integrated circuit to be coupled with said printed circuit board, said photodiode chip, said automatic power control integrated circuit, and said laser diode chip.

4. A laser module with flattened structure on a mobile device, comprising:
a mobile device including a housing with an opening hole, a motherboard installed in the housing, a microprocessor installed on the motherboard, a memory unit installed on the motherboard and electrically connected to the microprocessor, a camera unit installed on a rear surface of the housing and electrically connected to the microprocessor to retrieve an image at a pre-determined angle with a horizontal distance shown on said image, and a touch screen installed on a front surface of the housing and electrically connected to the microprocessor to display the image;

a laser module with a flattened structure, including a printed circuit board including a top surface, a bottom surface, and a connecting section arranged under said bottom surface for electrical connection; a photodiode chip including a detection surface embedded on said printed circuit board for said detection surface to share a common plane surface with said top surface of said printed circuit board and for said photodiode chip to be coupled to said printed circuit board; an automatic power control integrated circuit including a first surface and embedded on said printed circuit board for said first surface to share a common plane surface with said top surface of said printed circuit board and with said detection surface of said photodiode chip and for said automatic power control integrated circuit to be coupled to said printed circuit board and said photodiode chip; a laser diode chip including a connecting surface and electrically connected to said printed circuit board for said connecting surface to share a common plane surface with said top surface of said printed circuit board, said detection surface of said photodiode chip, and said first surface of said automatic power control integrated circuit and for the laser diode chip to be coupled with said printed circuit board, said photodiode chip, and said automatic power control integrated circuit; a case body encapsulating the printed circuit board, the photodiode chip, the automatic power control integrated circuit and the laser diode chip and leaving the connecting section of the printed circuit board uncovered outside said case body, said case body further including a light emitting hole; a collimating lens disposed in said case body at a front of said laser diode chip to collimate said first laser beam and form a collimated light; and a reflector disposed in said case body at a front of said collimating lens at an angle of 135° to refract said collimated light at 90° to said light emitting hole of the case body, whereby the collimated light is emitted by the laser module to the opening hole of the housing of the mobile device; the connecting section of the printed circuit board is adhered on the motherboard of the mobile device for the laser module with flattened structure to be operated by the microprocessor; and the laser module is arranged at a pre-determined distance from the camera unit and projecting a collimated light parallel with an optic axis retrieved by the camera unit, said optic axis and collimated light respectively adjusted perpendicularly to a horizontal distance on the image for an end of said optic axis and a point of the collimated light both projected to said horizontal distance; and a camera program installed in the memory unit and operated by the microprocessor to activate the camera unit, record the image and thereby retrieve an image data, said image data including pixel values for further retrieving of a set of pixel values horizontally and a pixel value of a dot within the set of pixel value; whereby the microprocessor matches the set of pixel values with the horizontal distance and sets the point of the collimated light as the dot in the image, rendering a reference point for measurement with the pixel value of the dot.

5. The laser module with flattened structure on a mobile device as claimed in claim 4, wherein the laser diode chip comprises a negative electrode layer and a positive electrode layer, said positive electrode layer including a ridge section, and has a first end and a second end respectively emitting a first laser beam and a second laser beam, said laser diode chip disposed partially on said printed circuit board for said first end to remain out of contact from said top surface of said printed circuit board, thereby avoiding the first laser beam from being emitted to said top surface, and for said second end to be close to said detection surface of said photodiode chip, thereby emitting the second laser beam to said detection surface for operation; whereby upon the detection surface of the photodiode chip detecting a power range of the second laser beam, the automatic power control integrated circuit adjusts a power range of the first laser beam accordingly.

6. The laser module with flattened structure on a mobile device as claimed in claim 4, further comprising a high-frequency modulation integrated circuit embedded on the printed circuit board and including a second surface for said second surface to share a common plane surface with said top surface of said printed circuit board, said detection surface of said photodiode chip, said first surface of said automatic power control integrated circuit, and said connecting surface of said laser diode chip for the high-frequency modulation integrated circuit to be coupled with said printed circuit board, said photodiode chip, said automatic power control integrated circuit, and said laser diode chip.

7. The laser module with flattened structure on a mobile device as claimed in claim 4, wherein the point of the collimated light rendered as the reference point is located within an angle half of the pre-determined angle set for image taking of the camera program and within half of the set of the pixel values, said angle half of a pre-determined angle rendered as a first parameter and a distance from the reference point to the optic axis rendered as a second parameter so that a distance between the laser module and the reference point is calculated by the first and second parameters with functions of tangent and cotangent in the trigonometric functions.

8. The laser module with flattened structure on a mobile device as claimed in claim 4, wherein the camera program further has a zooming frame on the image for focusing on the point of the collimated light by finger touching and for setting the pixel value of the point as the pixel value of the dot, thereby a circle for recognition is circling around the dot and a secondary window is displayed on the touch screen with a cross mark to display an enlarged view of the dot for further recognition of a center of the dot by finger touching.

9. The laser module with flattened structure on a mobile device as claimed in claim 4, wherein the microprocessor displays a line with measurement data near the dot as the reference point on the touch screen according to the pixel value of the dot after calculation and both ends of the line are extendable by finger touching on the touch screen for further measurement.

10. The laser module with flattened structure on a mobile device as claimed in claim 4, wherein the microprocessor displays an area with measurement data near the dot as the reference point on the touch screen according to the pixel value of the dot after calculation and the area includes at least three ends that are extendable by finger touching on the touch screen for further measurement.

11. A laser module with a flattened structure, comprising:
a printed circuit board including a top surface, a bottom surface, and a connecting section arranged under said bottom surface for electrical connection;
a photodiode chip including a detection surface and embedded on said printed circuit board for said detection surface to share a common plane surface with said top surface of said printed circuit board and for said photodiode chip to be coupled to said printed circuit board;
an automatic power control integrated circuit including a first surface and embedded on said printed circuit board for said first surface to share a common plane surface with said top surface of said printed circuit board and with said detection surface of said photodiode chip and for said automatic power control integrated circuit to be coupled to said printed circuit board and said photodiode chip;
a laser diode chip including a connecting surface and electrically connected to said printed circuit board for said connecting surface to share a common plane surface with said top surface of said printed circuit board, said detection surface of said photodiode chip, and said first surface of said automatic power control integrated circuit and for the laser diode chip to be coupled with said printed circuit board, said photodiode chip, and said automatic power control integrated circuit; and
a case body to encapsulate the printed circuit board, the photodiode chip, the automatic power control integrated circuit and the laser diode chip and leave the connecting section of the printed circuit board uncovered outside said case body, said case body including a light emitting hole; a collimating lens disposed in said case body at a front of said laser diode chip to collimate said first laser beam and form a collimated light; a reflector disposed in said case body at a front of said collimating lens at an angle of 135° to refract said collimated light at 90° to said light emitting hole of the case body.

\* \* \* \* \*